US009257616B2

(12) United States Patent
Harvey et al.

(10) Patent No.: US 9,257,616 B2
(45) Date of Patent: Feb. 9, 2016

(54) MOLDED LED PACKAGE AND METHOD OF MAKING SAME

(71) Applicant: GLO AB, Lund (SE)

(72) Inventors: Douglas Harvey, Sunnyvale, CA (US); Ronald Kaneshiro, Los Altos, CA (US)

(73) Assignee: GLO AB, Lund (SE)

( * ) Notice: Subject to any disclaimer, the term of this patent is extended or adjusted under 35 U.S.C. 154(b) by 0 days.

(21) Appl. No.: 14/465,947

(22) Filed: Aug. 22, 2014

(65) Prior Publication Data

US 2015/0060903 A1    Mar. 5, 2015

Related U.S. Application Data

(60) Provisional application No. 61/870,312, filed on Aug. 27, 2013, provisional application No. 61/870,323, filed on Aug. 27, 2013, provisional application No. 61/969,629, filed on Mar. 24, 2014.

(51) Int. Cl.
*H01L 33/62* (2010.01)
*H01L 33/48* (2010.01)
*H01L 23/00* (2006.01)
(Continued)

(52) U.S. Cl.
CPC .............. *H01L 33/486* (2013.01); *H01L 24/97* (2013.01); *H01L 25/0753* (2013.01); *H01L 33/504* (2013.01); *H01L 33/62* (2013.01); *H01L 2224/48091* (2013.01); *H01L 2224/48247* (2013.01); *H01L 2224/48257* (2013.01); *H01L 2933/0033* (2013.01); *H01L 2933/0066* (2013.01)

(58) Field of Classification Search
None
See application file for complete search history.

(56) References Cited

U.S. PATENT DOCUMENTS

| | | |
|---|---|---|
| 6,184,544 B1 | 2/2001 | Toda et al. |
| 6,335,545 B1 | 1/2002 | Toda et al. |
| 7,318,651 B2 | 1/2008 | Chua et al. |

(Continued)

FOREIGN PATENT DOCUMENTS

| | | |
|---|---|---|
| CN | 102427075 B | 8/2013 |
| EP | 1837386 A1 | 9/2007 |

(Continued)

OTHER PUBLICATIONS

Harvey, D. et al., "Molded LED Package," U.S. Appl. No. 14/031,829, filed Sep. 19, 2013.

(Continued)

*Primary Examiner* — Michelle Mandala
*Assistant Examiner* — Tyler Drye
(74) *Attorney, Agent, or Firm* — The Marbury Law Group PLLC

(57) ABSTRACT

Packaged light emitting diodes (LEDs) and methods of packaging a LED include providing a first lead having a first recess in a bottom surface and a second lead having a second recess in a bottom surface, placing a LED die over a top surface of at least one of the first and the second leads, electrically connecting the LED die to the first lead and to the second lead, forming a package around the LED die that includes an opening in its upper surface exposing at least the LED die, and separating the package containing the LED die, the first lead and the second lead from a lead frame such that the package contains a first castellation and a second castellation in a side surface of the package, such that the castellations expose the leads and/or a first platable metal which is electrically connected to the leads.

16 Claims, 8 Drawing Sheets

(51) Int. Cl.
*H01L 33/50* (2010.01)
*H01L 25/075* (2006.01)

(56) References Cited

U.S. PATENT DOCUMENTS

| | | | |
|---|---|---|---|
| 7,335,908 | B2 | 2/2008 | Samuelson et al. |
| 7,396,696 | B2 | 7/2008 | Kim et al. |
| 7,471,040 | B2 | 12/2008 | Nishimura |
| 7,829,443 | B2 | 11/2010 | Seifert et al. |
| 8,304,268 | B2 | 11/2012 | Lin et al. |
| 8,410,507 | B2 * | 4/2013 | Stauss et al. ............ 257/98 |
| 8,420,414 | B2 | 4/2013 | Horiuchi et al. |
| 8,519,611 | B2 | 8/2013 | Radkov et al. |
| 8,530,250 | B2 | 9/2013 | Ichikawa et al. |
| 8,556,488 | B2 | 10/2013 | Lee |
| 2002/0028525 | A1 | 3/2002 | Sakamoto et al. |
| 2004/0159850 | A1 | 8/2004 | Takenaka |
| 2005/0151149 | A1 | 7/2005 | Chia et al. |
| 2007/0126011 | A1 | 6/2007 | Lee |
| 2007/0138697 | A1 | 6/2007 | Takeda et al. |
| 2007/0247841 | A1 | 10/2007 | Kono et al. |
| 2008/0012036 | A1 | 1/2008 | Loh et al. |
| 2008/0054287 | A1 | 3/2008 | Oshio et al. |
| 2008/0316741 | A1 | 12/2008 | Lee |
| 2009/0194782 | A1 | 8/2009 | Hata et al. |
| 2009/0207111 | A1 | 8/2009 | Wang et al. |
| 2009/0243504 | A1 | 10/2009 | Cho et al. |
| 2010/0140638 | A1 | 6/2010 | Kotani et al. |
| 2010/0270571 | A1 | 10/2010 | Seo |
| 2011/0049552 | A1 | 3/2011 | Pyeon et al. |
| 2011/0220920 | A1 | 9/2011 | Collins et al. |
| 2011/0309382 | A1 | 12/2011 | Lowgren |
| 2012/0104445 | A1 | 5/2012 | Yang et al. |
| 2012/0273826 | A1 * | 11/2012 | Yamamoto et al. ............ 257/99 |
| 2012/0281154 | A1 | 11/2012 | Yokoyama |
| 2013/0017631 | A1 | 1/2013 | Takeda et al. |
| 2013/0062632 | A1 * | 3/2013 | Lee ................ 257/88 |
| 2013/0153952 | A1 | 6/2013 | Yamashita et al. |
| 2014/0061697 | A1 | 3/2014 | Lin et al. |

FOREIGN PATENT DOCUMENTS

| | | |
|---|---|---|
| JP | 11087780 | 3/1999 |
| JP | 11214754 | 8/1999 |
| JP | 2000174347 | 6/2000 |
| JP | 2001036154 | 2/2001 |
| JP | 2002217454 A | 8/2002 |
| JP | 2006140207 | 6/2006 |
| JP | 2006313943 A | 11/2006 |
| JP | 2007035794 | 2/2007 |
| JP | 2007123302 | 5/2007 |
| JP | 2007235085 | 9/2007 |
| JP | 2008106226 | 5/2008 |
| JP | 2010092705 A | 4/2010 |
| JP | 2010197840 A | 9/2010 |
| JP | 2010232529 A | 10/2010 |
| JP | 2011159832 A | 8/2011 |
| JP | 2011243963 A | 12/2011 |
| JP | 2012234955 A | 11/2012 |
| KR | 20070077574 A | 7/2007 |
| KR | 20090055402 A | 6/2009 |
| KR | 20090057755 A | 6/2009 |
| KR | 20090108171 A | 10/2009 |
| WO | 2006126438 A1 | 11/2006 |
| WO | 2007037662 | 4/2007 |
| WO | 2007102781 A1 | 9/2007 |
| WO | 2007135707 A1 | 11/2007 |
| WO | 2008048704 A3 | 4/2008 |
| WO | 2008051397 | 5/2008 |
| WO | 2008059856 A1 | 5/2008 |
| WO | 2009002911 | 12/2008 |
| WO | 2010014032 A1 | 2/2010 |
| WO | 2011162715 A1 | 12/2011 |
| WO | 2012029912 A1 | 3/2012 |
| WO | 2013021941 | 2/2013 |

OTHER PUBLICATIONS

Harvey, D. et al., "Method of Making Molded LED Package," U.S. Appl. No. 14/031,751, filed Sep. 19, 2013.

International Search Report and Written Opinion received in connection with international application No. PCT/US2014/052232; dated Dec. 1, 2014.

Notice of Allowance and Fee(s) Due, for U.S. Appl. No. 14/031,751, filed Sep. 19, 2013.

Notice of Allowance and Fee(s) Due mailed May 26, 2015, for U.S. Appl. No. 14/031,829, filed Sep. 19, 2013.

* cited by examiner

MOLDED LED PACKAGE AND METHOD OF MAKING SAME

RELATED APPLICATIONS

This application claims the benefit of U.S. Provisional Application Nos. 61/870,312, filed Aug. 27, 2013, 61/870,323, filed Aug. 27, 2013, and 61/969,629, filed Mar. 24, 2014, the entire contents of all of which are incorporated herein by reference.

FIELD

The embodiments of the invention are directed generally to packaged light emitting diode (LED) devices and methods of packaging LED devices.

BACKGROUND

Light emitting diodes (LEDs), such as nanowire LEDs, have a variety of uses, including in electronic displays, such as liquid crystal displays in laptops or LED televisions. In a typical LED packaging process, a semiconductor die containing one or more LEDs is mounted to a lead frame, and the die and lead frame are encased in a protective mold. The mold may include an open region aligned with the LED that enables light to be emitted from the LED. Electrical connections to the LED package may be made via the lead frame. Further improvements in LED packaging would be desirable.

SUMMARY

Various embodiments include methods of packaging a light emitting diode (LED) that include providing a lead frame comprising a first lead having a first recess in a bottom surface and a second lead having a second recess in a bottom surface, placing a LED die over a top surface of at least one of the first and the second leads, electrically connecting the LED die to the first lead and to the second lead, forming a package around the LED die, the first lead and the second lead, the package having an opening in its upper surface exposing at least the LED die, and separating the package containing the LED die, the first lead and the second lead from the lead frame such that the package contains a first castellation and a second castellation in a side surface of the package, wherein the first castellation exposes at least one of the first lead and a first platable metal which is electrically connected to the first lead, the second castellation exposes at least one of the second lead and a second platable metal which is electrically connected to the second lead.

Further embodiments include methods of packaging a light emitting diode (LED) that include providing a lead frame comprising a first lead and a second lead, placing a LED die over a top surface of at least one of the first and the second leads, electrically connecting the LED die to the first lead and to the second lead, forming a package around the LED die, the first lead and the second lead, the package having an opening in its upper surface exposing at least the LED die, and separating the package containing the LED die, the first lead and the second lead from the lead frame, wherein the lead frame contains a first alignment mark and the package contains a second alignment mark.

Further embodiments include methods of packaging light emitting diodes (LEDs) that include bonding a plurality of LED die over a plurality of leads of a lead frame, electrically connecting each of the plurality of LED die to a respective two of the plurality of leads, dipping the lead frame into a mold containing a moldable material, solidifying the moldable material to form a panel comprising a plurality of moldable material packages attached to the lead frame, wherein each of the plurality of packages is located around at least one of the plurality of LED dies electrically connected to the respective two of the plurality of leads, attaching a first set of the plurality of packages to a dicing tape, and singulating the first set of the plurality of packages from the panel.

Further embodiments include methods of testing a packaged light emitting diode (LED) that include providing a package containing a LED die which is electrically connected to a first lead and to a second lead located in the package, wherein the LED die is located over a top surface of at least one of the first and the second leads, attaching a bottom surface of the package to dicing tape such that a first recess is located in a bottom surface of the first lead exposed in the bottom surface of the package and a second recess is located in a bottom surface of the second lead exposed in the bottom surface of the package, and testing the LED die by poking a testing pin or needle through the dicing tape into at least one of the first recess and the second recess.

Various embodiments include packaged light emitting diode (LED) devices that include a first lead having a first recess in a bottom surface, a second lead having a second recess in a bottom surface, a LED die located over a top surface of at least one of the first and the second leads and electrically connected to the first lead and to the second lead, and a package located around the LED die, the first lead and the second lead, wherein the package contains an opening in its upper surface exposing at least the LED die, and the package contains a first castellation and a second castellation in a side surface of the package, the first castellation exposes at least one of the first lead and a first platable metal which is electrically connected to the first lead, and the second castellation exposes at least one of the second lead and a second platable metal which is electrically connected to the second lead.

Further embodiments include packaged light emitting diode (LED) devices that include a first lead having a first recess in a bottom surface, a second lead having a second recess in a bottom surface, a LED die located over a top surface of at least one of the first and the second leads and electrically connected to the first lead and to the second lead, a package located around the LED die, the first lead and the second lead, and wherein a sidewall of the package has a non-uniform thickness and contains at least one structural strength enhancing region of increased thickness.

Further embodiments include packaged light emitting diode (LED) devices that include a first lead having a first recess in a bottom surface, a second lead having a second recess in a bottom surface, a LED die located over a top surface of at least one of the first and the second leads and electrically connected to the first lead and to the second lead, a package located around the LED die, the first lead and the second lead, and wherein sides and ends of the first and the second leads are etched to increase a surface area of the first and the second leads.

Further embodiments include a lead frame including a frame connected to a plurality of electrically conductive leads, wherein at least one of the plurality of leads comprises a floating finger lead which contains at least one free hanging, cantilevered end which is not attached to the frame.

BRIEF DESCRIPTION OF THE DRAWINGS

The accompanying drawings, which are incorporated herein and constitute part of this specification, illustrate example embodiments of the invention, and together with the general description given above and the detailed description given below, serve to explain the features of the invention.

DETAILED DESCRIPTION

The various embodiments will be described with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Embodiments of the invention include packaged LED devices and methods of packaging an LED. In various embodiments, a package and lead design includes features that enable the packaged LED device to be mounted as either a top-emitting or a side-emitting LED package.

Figure 1:
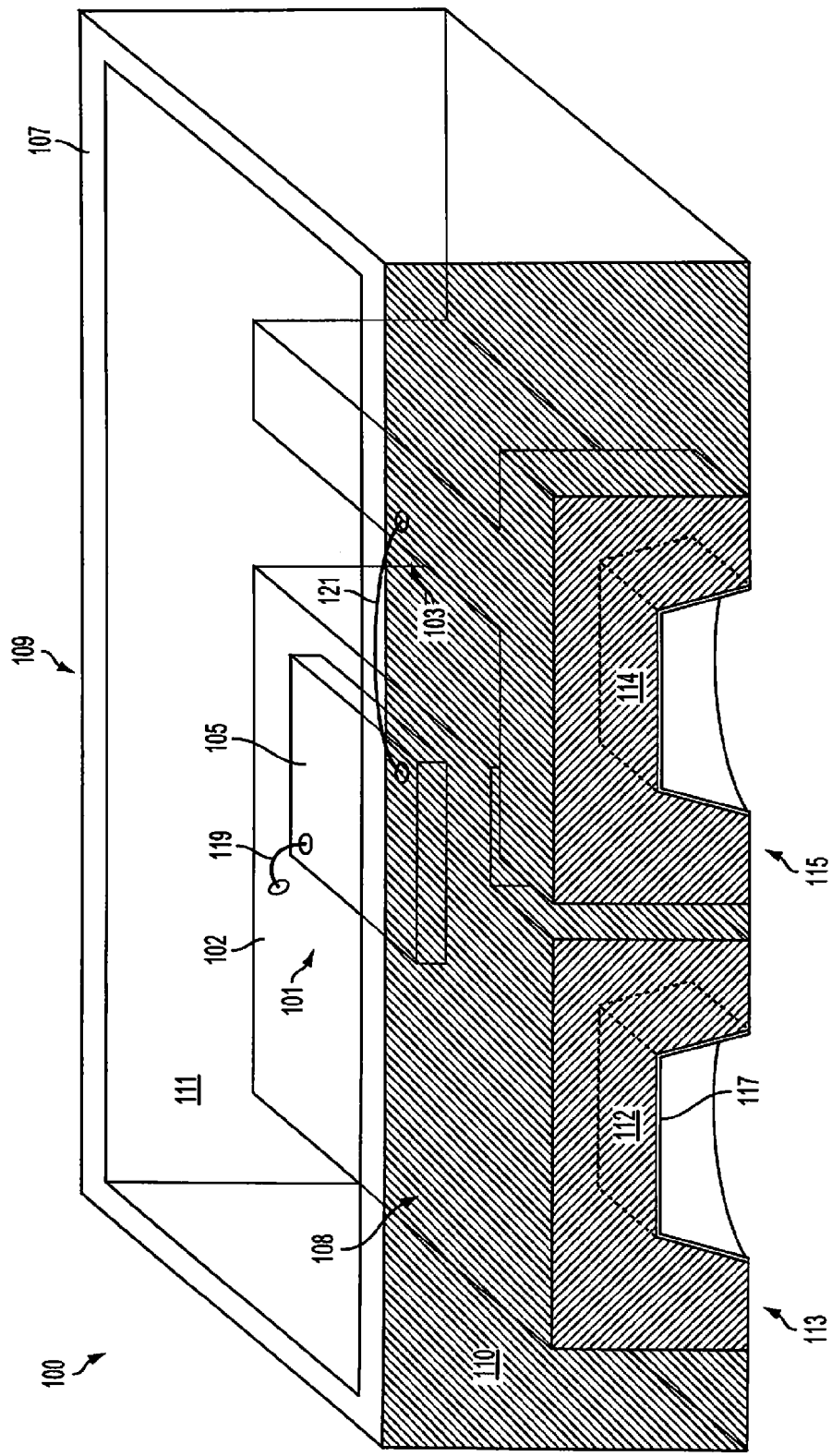
FIG. 1 is a schematic perspective illustration of a packaged LED device according to an embodiment.

FIG. 1 is a schematic perspective illustration of a packaged LED device 100 according to one embodiment. The packaged LED device 100 includes a plurality of leads, including a first lead 101 and a second lead 103. Each lead 101, 103 may be formed of an electrically conductive material (e.g., a metal, such as copper). The leads 101, 103 may be formed as part of a lead frame and separated from the frame to produce individual packaged LED devices 100, as described below. The leads 101, 103 may extend generally parallel without contacting one another between a first side surface 108 and a second side surface 109 of the device 100.

At least one LED die 105 (e.g., chip) may be mounted on a first surface 102 of lead 101. The LED die 105 may include one or more light-emitting semiconductor elements on a supporting substrate. Any suitable LED structure may be utilized. In embodiments, the LED may be a nanowire-based LED. Nanowire LEDs are typically based on one or more pn- or pin-junctions. Each nanowire may comprise a first conductivity type (e.g., doped n-type) nanowire core and an enclosing second conductivity type (e.g., doped p-type) shell for forming a pn or pin junction that in operation provides an active region for light generation. An intermediate active region between the core and shell may comprise a single intrinsic or lightly doped (e.g., doping level below $10^{16}$ cm$^{-3}$) semiconductor layer or one or more quantum wells, such as 3-10 quantum wells comprising a plurality of semiconductor layers of different band gaps. Nanowires are typically arranged in arrays comprising hundreds, thousands, tens of thousands, or more, of nanowires side by side on the supporting substrate to form the LED structure. The nanowires may comprise a variety of semiconductor materials, such as III-V semiconductors and/or III-nitride semiconductors, and suitable materials include, without limitation GaAs, InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, AN, GaP and Si. The supporting substrate may include, without limitation, III-V or II-VI semiconductors, Si, Ge, $Al_3O_3$, SiC, Quartz and glass. Further details regarding nanowire LEDs and methods of fabrication are discussed, for example, in U.S. Pat. Nos. 7,396,696, 7,335,908 and 7,829,443, PCT Publication Nos. WO2010014032, WO2008048704 and WO2007102781, and in Swedish patent application SE 1050700-2, all of which are incorporated by reference in their entirety herein. Alternatively, bulk (i.e., planar layer type) LEDs may be used instead of or in addition to the nanowire LEDs.

The LED die 105 may be mounted to the first surface 102 of the lead 101 using any suitable bonding technique. In embodiments, the surface of the LED die 105 may be electrically insulated from the lead 101 via an insulating material (e.g., a sapphire layer), which may be or may form part of the support substrate of the die 105. The active region of the LED die 105 may be electrically connected to the first lead 101 by a first wire 119, which may be bonded to a first bond pad region of the die 105. A second wire 121 may be bonded to a second bond pad region of the die 105 to electrically connect the die 105 to the second lead 103.

The packaged LED device 100 also includes a package 107, which may be a protective mold around the die 105 and leads 101, 103. For clarity, the package 107 is shown as transparent in FIG. 1. In embodiments, the package 107 may be a molded epoxy material, although other materials (e.g., ceramic, plastic, glass, etc.) may be utilized. The leads 101, 103 may be at least partially embedded in the package 107. As shown in FIG. 1, the package 107 may form the sidewalls and at least a portion of the bottom surface of the device 100 and may include an opening 111 in its upper surface exposing at least the LED die 105. In some embodiments, the opening 111 may be filled with an encapsulant material (not shown) that is optically transmissive over at least a selected wavelength range. The encapsulant may comprise a phosphor or dye material.

The leads 101, 103 may each include a recessed portion 112, 114 on a bottom surface of the respective leads 101, 103 (i.e., on the surface opposite the LED die 105). The package 107 may include a first castellation 113 and a second castellation 115 in a side surface 110 of the package 107. The first castellation 113 exposes an edge of the first lead 101 including the recessed portion 112. The second castellation 115 exposes an edge of the second lead 103 including the recessed portion 114. Each of the recessed portions 112, 114 may include a filler material 117, which may be a platable metal formed over the recessed portions 112, 114. Thus, in an embodiment, the first castellation 113 exposes an edge of the first lead 101 and platable metal 117, and the second castellation 115 exposes an edge of the second lead 103 and the platable metal 117.

In the embodiment of FIG. 1, the leads 101, 103 have non-uniform dimensions along their length between the first end 108 and the second end 109 of the device 100. As shown in FIG. 1, the cross-sectional dimensions of the leads 101, 103 are identical proximate the first end 108, including in the portions containing the respective recessed portions 112, 114, but are different proximate to the second end 108 of the device. The first lead 101 has an "L" shape in which the width of the lead 101 increases to accommodate the LED die 105. The second lead 103 is widest proximate to the first end 108, and narrows proximate to the second end 109. Various other configurations are possible, including where the leads 101, 103 have identical shapes along their entire lengths. Preferably, the LED die 105 is bonded to only to the top surface 102 of a rear portion of the first lead 101, the first recess 112 is located in the bottom surface in a front portion of the first lead 101 which is different from the rear portion of the first lead, and the second recess 114 is located in the bottom surface in a front portion of the second lead 103 which is wider than rear portion of the second lead.

Figure 2A:
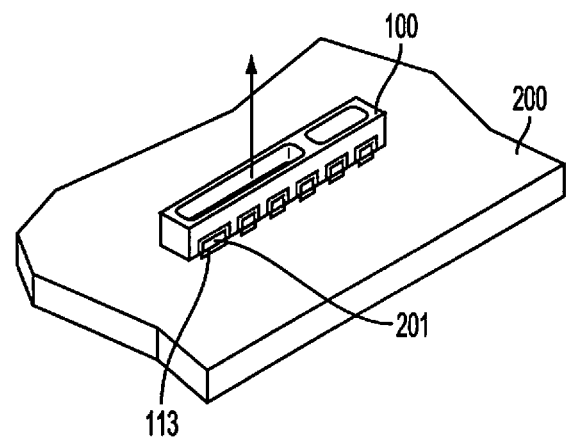
FIG. 2A illustrates the packaged LED device mounted in a top-emitting configuration.
Figure 2B:
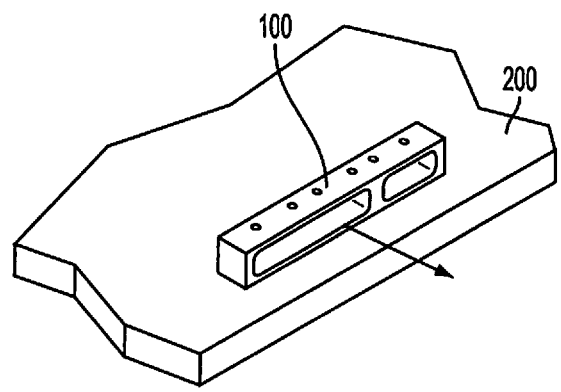
FIG. 2B illustrates the packaged LED device mounted in a side-emitting configuration.

The packaged LED device 100 may be mounted to a support surface 200 in either a top-emitting or a side-emitting configuration, as shown in FIGS. 2A-B. FIG. 2A shows the device 100 in a top-emitting configuration, with the predominant direction of light emission from the LED indicated by the vertical arrow. At least a portion of the leads 101, 103, including at least the recessed portions 112, 114, may be exposed on the bottom surface of the package 107. Electrical contacts 201 located over the support surface 200 may contact the exposed portions of the respective leads 101, 103 to connect the leads 101, 103 and the LED die 105 to an external current/voltage source. In embodiments, the electrical contacts 201 may be bonded to the leads 101, 103, such as via soldering. In some embodiments, the electrical contacts 201 may be soldered to the optional filler material 117 that may be located within the recessed portions 112, 114 of the leads 101, 103.

FIG. 2B shows the device 100 in a side-emitting configuration, in which the side surface 110 of the package 107 containing the castellations 113, 115 (see FIG. 1) faces the support structure 200 and the predominant direction of light emission (as indicated by the arrow) is parallel to the support surface 200. In this configuration, the electrical contacts 201 on the support structure 200 (not visible in this view) contact the first and second leads 101, 103 through the first and second castellations 113, 115, respectively. As in the embodiment of FIG. 2A, the electrical contacts 201 may be bonded (e.g., soldered) to the leads, either directly or indirectly through the optional filler material. The side-emitting configuration of FIG. 2B may provide improved coupling of light into a waveguide.

Figure 3A:
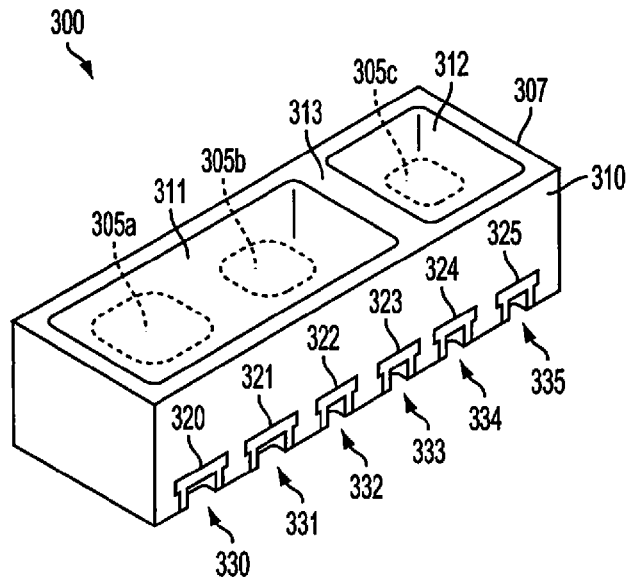
FIG. 3A illustrates a packaged LED device according to one embodiment in which the package includes multiple LED dies and an interior wall separating a first compartment containing the at least one first LED die from a second compartment containing at least one second LED die.

The embodiment of FIG. 1 illustrates a package for a single LED die. In other embodiments, multiple LED dies may be included within a package. FIG. 3A illustrates an embodiment of a packaged LED device 300 in which the package 307 includes multiple LED dies 305a, 305b, 305c and an interior wall 313 separating a first compartment 311 containing LED dies 305a, 305b from a second compartment 312 containing LED die 305c. Each of the LED dies 305a, 305b, 305c may be configured to emit light at different wavelengths (e.g., green, blue and red visible light). The packaged LED device 300 may include a plurality of leads 320, 321, 322, 323, 324, 325, each having a recessed portion as described above in connection with FIG. 1. Each of the dies 305a, 305b, 305c may be mounted on a top surface of a lead and electrically connected to at least two different leads, as described above. The package 307 may include castellations 330, 331, 332, 333, 334, 335, 336 on a side surface 310 of the package 307 that expose the edges of the leads 320, 321, 322, 323, 324, 325 at their respective recessed portions.

In one embodiment, the interior wall 313 may separate the second compartment 312 containing a red-emitting LED die 305c from the first compartment 311 containing a green-emitting LED die 305a and a blue-emitting LED die 305b. The second compartment 312 may contain a first encapsulant (not shown) containing a red emitting phosphor located over the red LED die 305c, and the first compartment 311 may contain a second encapsulant (not shown) which lacks the red emitting phosphor located over the green-emitting LED die 305a and the blue-emitting LED die 305b. Each die may contain nanowire and/or bulk LEDs. For example, the green emitting die 305a may comprise nanowire LEDs, the red emitting die 305c may comprise bulk LEDs, and the blue emitting die 305b may comprise either nanowire or bulk LEDs.

Figure 3B:
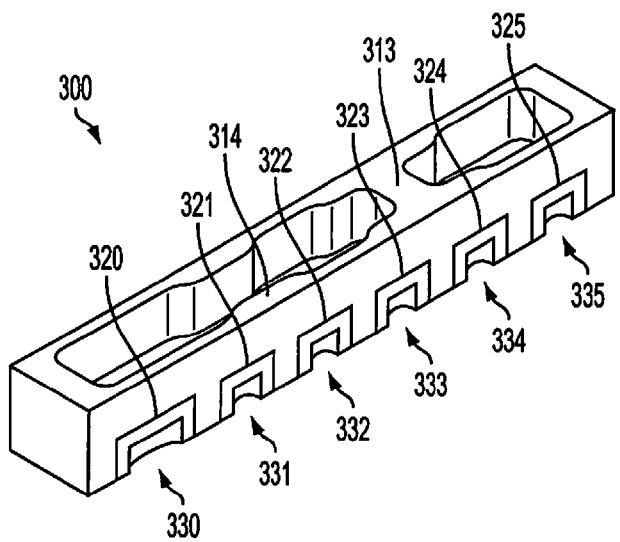
FIG. 3B illustrates a packaged LED device according to another embodiment in which a sidewall of the package has a non-uniform thickness and contains structural strength enhancing regions of increased thickness.

FIG. 3B illustrates an alternative embodiment of the packaged LED device 300 in which the package 307 includes a variable wall thickness and an internal radius to add wall thickness in select areas and thus increase the package structural strength, such as a structural strength enhancing region 314 of increased thickness in a sidewall of the package. FIG. 3B also illustrates castellations 330, 331, 332, 333, 334, 335 and leads 320, 321, 322, 323, 324, 325 having varying dimensions (e.g., at castellation 330 and lead 320 are wider than the other castellations and leads in the device 300).

Figure 3C:
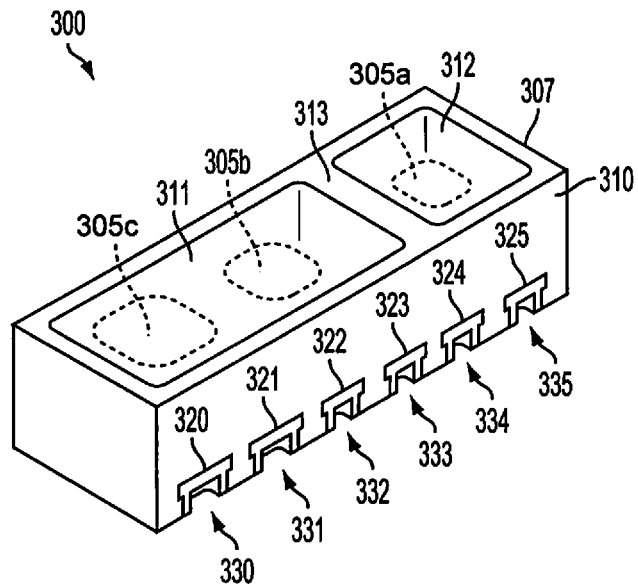
FIG. 3C illustrates a packaged LED device according to another embodiment in which the package includes multiple LED dies and an interior wall separating a first compartment containing a green emitting LED die and a first encapsulant containing a green phosphor located over the green emitting LED die from a second compartment containing a red emitting LED die and a blue emitting LED die and a second encapsulant which lacks the green phosphor located over the red emitting LED die and the blue emitting LED die.

FIG. 3C illustrates another embodiment of a packaged LED device 300. The device 300 may be similar to the device of FIG. 3A, but in this embodiment, the second compartment 312 separated by the interior wall 313 contains a green-emitting LED die 305a, and the first compartment 311 contains a blue-emitting LED die 305b and a red-emitting LED die 305c. The second compartment 312 may contain a first encapsulant (not shown) containing a green-emitting phosphor located over the green-emitting LED die 305a, and the first compartment 311 may contain a second encapsulant (not shown) which lacks the green emitting phosphor over the blue-emitting LED die 305a and the red-emitting LED die 305c. Each die may contain nanowire and/or bulk LEDs. In addition, the LED device 300 of FIG. 3C may include a variable wall thickness and internal radius to enhance structural strength and/or castellations 330, 331, 332, 333, 334, 335 having varying dimensions such as shown in FIG. 3B.

Figure 3D:
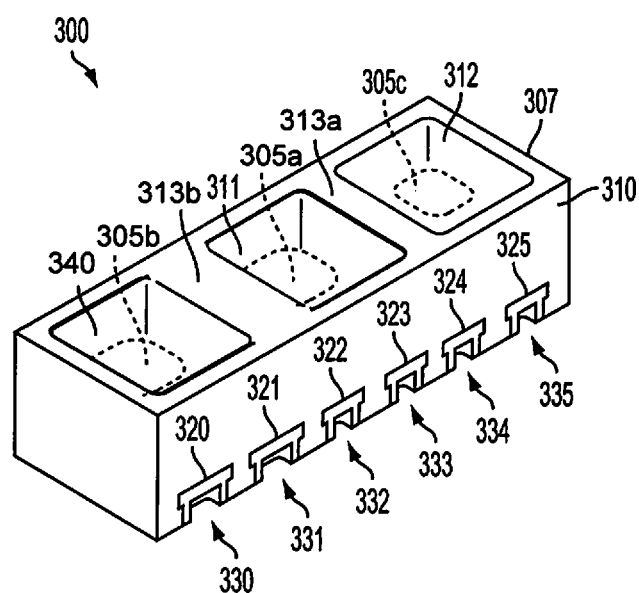
FIG. 3D illustrates a packaged LED device according to another embodiment in which the package includes multiple LED dies and two interior walls defining three separate compartments, where each compartment contains at least one LED die.

FIG. 3D illustrates yet another embodiment of a packaged LED device. The device 300 may be similar to the devices shown in FIGS. 3A and 3C, but may include two interior walls 313a, 313b that separate the device 300 into three compartments 311, 312, 340. Each compartment 311, 312, 340 may contain at least one LED die 305a, 305b, 305c. For example, compartment 340 may contain a first one of a blue-emitting LED die 305b, a green-emitting LED die 305a, and a red-emitting LED die 305c (e.g., compartment 340 contains a blue-emitting LED die 305b in FIG. 3D), compartment 311 may contain a second one of the blue-emitting LED die 305b, the green-emitting LED die 305a and the red-emitting LED die 305c (e.g., compartment 311 contains a green-emitting LED die 305a in FIG. 3D), and compartment 312 may contain a third one of the blue-emitting LED die 305b, the green-emitting LED die 305a and the red-emitting LED die 305c (e.g., compartment 312 contains a red-emitting LED die 305c in FIG. 3D).

Each compartment 311, 312, 340 may contain an encapsulant (not shown) over the respective LED dies 305a, 305b, 305c. The encapsulant in each compartment 311, 312, 340 may be the same as or different than the encapsulant in the other compartments. In one embodiment, compartment 312 may contain a first encapsulant (not shown) containing a red emitting phosphor located over the red LED die 305c, compartment 311 may contain a second encapsulant (not shown) which lacks the red emitting phosphor located over the green-emitting LED die 305a, and compartment 340 may contain a third encapsulant (not shown) which lacks the red emitting phosphor located over the blue-emitting LED die 305b. The second encapsulant and the third encapsulant may be the same material or different materials.

In another embodiment, compartment 311 may contain a first encapsulant (not shown) containing a green emitting phosphor located over the green LED die 305a, compartment 312 may contain a second encapsulant (not shown) which lacks the green-emitting phosphor located over the red-emitting LED die 305c, and compartment 340 may contain a third encapsulant (not shown) which lacks the green-emitting phosphor located over the blue-emitting LED die 305b. The second encapsulant and the third encapsulant may be the same material or different materials in this embodiment.

In yet another embodiment, compartment 311 may contain a first encapsulant (not shown) containing a green emitting phosphor located over the green LED die 305a, compartment 312 may contain a second encapsulant (not shown) containing a red emitting phosphor located over the red LED die 305c, and compartment 340 may contain a third encapsulant (not shown) which lacks the green-emitting phosphor and the red-emitting phosphor located over the blue-emitting LED die 305b.

Each die in the respective compartments 311, 312, 340 may contain nanowire and/or bulk LEDs. Further, a packaged LED device 300 may include additional interior walls that separate the device into more than three compartments. In addition, the LED device 300 of FIG. 3D may include a variable wall thickness and internal radius to enhance structural strength and/or castellations 330, 331, 332, 333, 334, 335 having varying dimensions such as shown in FIG. 3B.

Figure 4A:
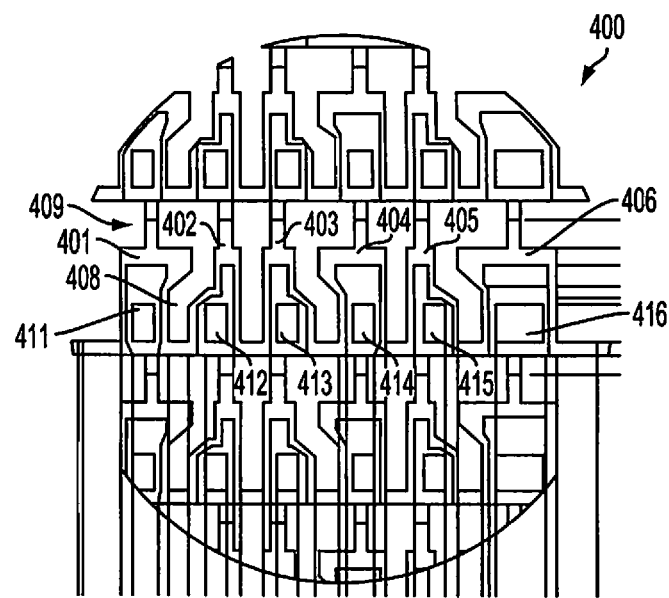
FIG. 4A illustrates a portion of a lead frame according to one embodiment in which the respective leads contain non-uniform recesses for forming castellations having varying widths and sides and ends of the leads are etched to increase a surface area of the leads.

FIG. 4A is a schematic top (overhead) view of a lead frame 400 having a plurality of leads 401, 402, 403, 404, 405, 406 used for producing a packaged LED device, such as device 300. The lead frame 400 may be formed, for example, by patterning (e.g., etching) a copper sheet or plate to form the frame 400 and leads 401, 402, 403, 404, 405, 406 in a desired shape. Pits (i.e., recesses) 411, 412, 413, 414, 415, 416 may be formed in a surface of the leads 401, 402, 403, 404, 405, 406 to provide the recessed portions. The sides 408 and ends 409 of the leads 401, 402, 403, 404, 405, 406 may be etched to increase a surface area for the package material (e.g. epoxy) to mate with and thus improve the adhesion of the leads to the package. The leads may be removed from the frame 400 to produce a packaged LED device, as described further below.

Figure 4B:
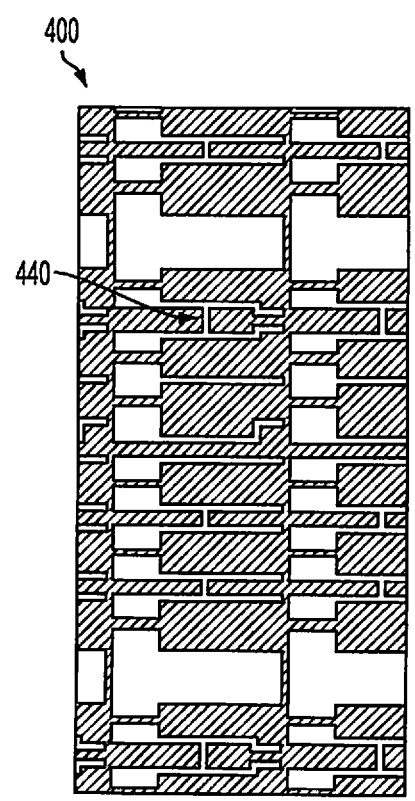
FIG. 4B illustrates a portion of a lead frame that includes floating finger leads which contain at least one free hanging, cantilevered end which is not attached to the frame.

FIG. 4B illustrates an alternative embodiment of a lead frame 400 having one or more "floating finger" leads 440 (i.e. a protrusion or finger that is not supported at both ends. e.g., which contains at least one free hanging, cantilevered end which is not attached to the frame). The floating finger lead frame may be made significantly wider to support it. The floating fingers allow for independent electrical connections inside the package after the leads are singulated (i.e., removed from the frame 400).

Figure 5A:
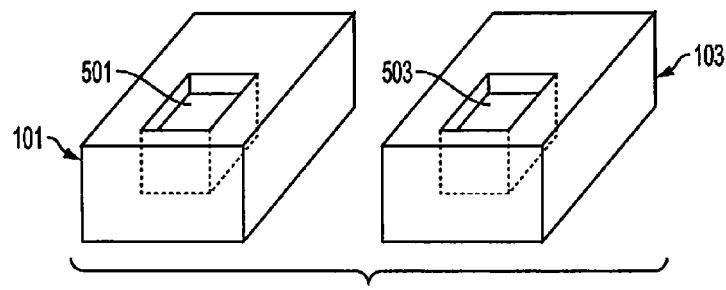
FIGS. 5A-D illustrate a method of packaging an LED die with a plurality of leads and a package according to one embodiment.

FIGS. 5A-D illustrate a method of packaging an LED die according to one embodiment. The method may include forming pits (i.e., recesses) 501, 503 in the back side of the respective leads 101, 103 of a lead frame, as shown in FIG. 5A. The leads frame having leads or "fingers" may be as shown in FIGS. 4A-B, for example. The leads 101, 103 are illustrated as rectangles for simplicity in FIG. 5A-D, although other shapes may be used. In addition, the frame that connects the leads 101, 103 is not illustrated for clarity.

Figure 5B:
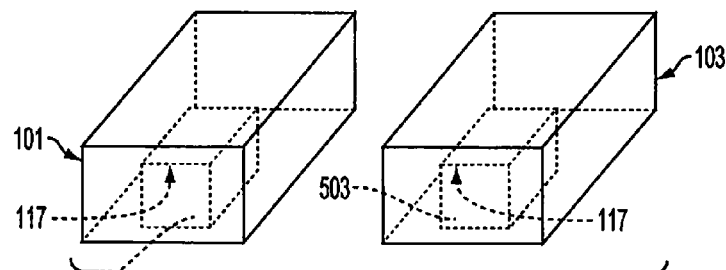
Figure 5C:
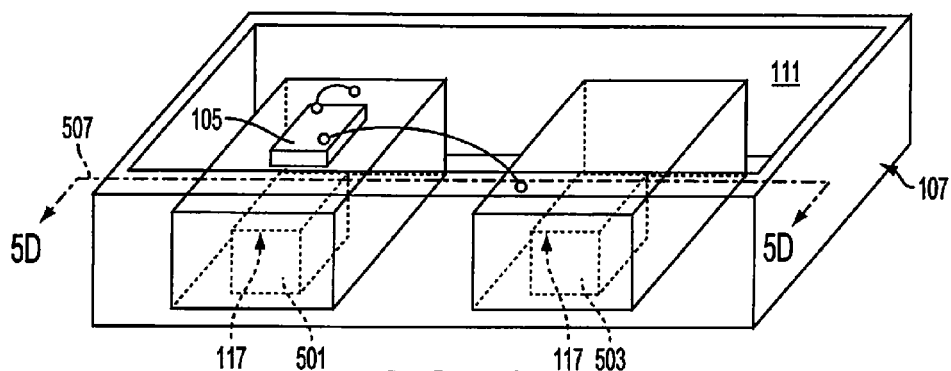
Figure 5D:
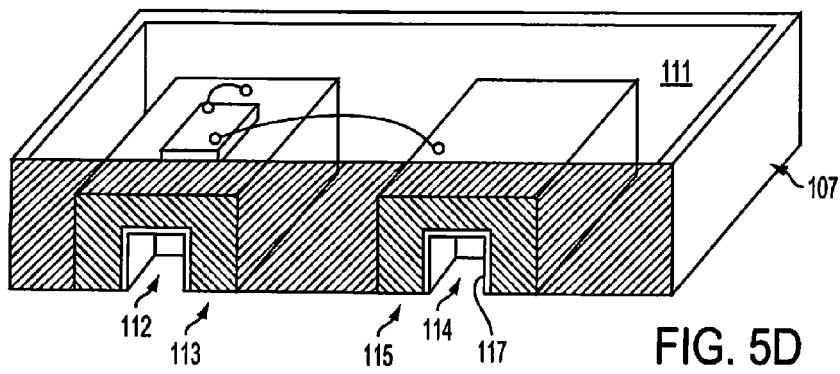

A metal filler 117 (e.g., a solderable metallization stack up) may be formed in the pits 501, 503, as shown in FIG. 5B. An LED die 105 may be bonded to the top surface of one or both leads 101, 103, as shown in FIG. 5C. The LED die 105 may be electrically connected to the leads 101, 103 by wires. The leads 101, 103 and LED die 105 may then be encapsulated by a package 107, which may be an epoxy material. The package 107 includes an opening 111 in its upper surface exposing at least the LED die 105.

Figure 6:
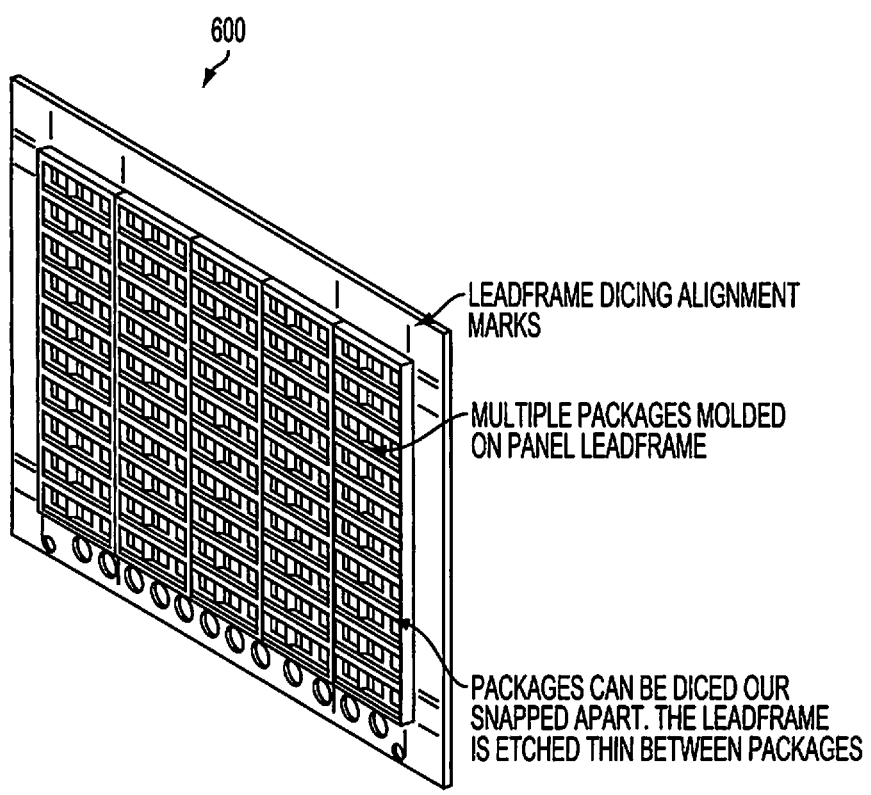
FIG. 6 illustrates a lead frame having a plurality of molded packages attached thereto and having alignment marks to facilitate separation of individual LED packages.

In embodiments, the package 107 may be formed by dipping a lead frame containing the leads 101, 103 and LED die(s) 105 into a mold containing an epoxy and solidifying the epoxy to form the package attached to the lead frame. Alternatively, the die 105 may be attached to the leads 101, 103 after the formation of the package 107 on the leads 101, 103. Thus, the LED die 105 may be electrically connected to the first lead and to the second lead by wire bonding the LED die to the first lead and to the second lead before or after the step of forming the package. A plurality of packages 107, each encapsulating a plurality of lead frame leads and one or more LED dies, may be formed over a lead frame 400 to form a panel 600 of packaged LEDs, as shown in FIG. 6. In embodiments, the molded panel 600 may have alignment marks (e.g., dicing lines) molded into the surface of the epoxy package walls. Similar marks, such as etched lines or slots, may be included in the lead frame 400. These features may facilitate inspection to check that the molded epoxy panel is aligned to the lead frame within specified tolerances. In addition, the alignment marks may aid a dicing operator in aligning a dicing saw blade to the panel and for quality assurance to check after dicing that the diced package walls are within tolerance. Thus, the singulation step may optionally include checking that a first alignment mark on the lead frame and a second alignment mark on the package (or on the panel) are within a predetermined tolerance, and aligning a dicing saw blade with the first alignment mark and the second alignment mark before dicing the package from the lead frame.

FIG. 5C illustrates a dicing line 507 in the epoxy package 107. The dicing line 507 may be aligned over the pits 501, 503 in the respective leads 101, 103 of the lead frame. The package 107 containing the LED die 105, the first lead 101 and the second lead 103 may then be separated from the lead frame, as shown in FIG. 5C. Separating the package 107 from the lead frame may include dicing or snapping the package along the dicing line 507 and through the pits 501, 503 to expose a first castellation 113 and a second castellation 115 in the side surface of the package 107. Dicing or otherwise separating the package 107 through the pits 501, 503 exposes the recessed portions 112, 114 of the leads 101, 103, as well as the filler material (e.g., solderable metal) which partially fills the pits.

Figure 7:
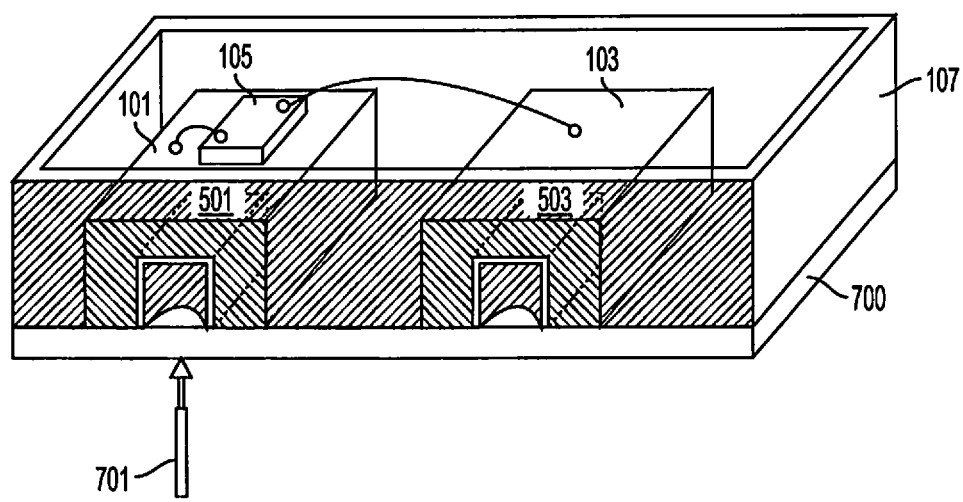
FIG. 7 schematically illustrates a method of testing an LED package using a testing pin according to one embodiment.

In embodiments, a dicing tape 700 may be bonded to the bottom surface of the package 107, prior to separating the package 107 from the lead frame (i.e., singulation), as shown in FIG. 7. The LED die 105 may be tested by poking a testing pin 701 or needle through the dicing tape 700 in the area of the pits 501, 503. The pits 501, 503 allow the tape 700 to stretch and the pin 701 to break through the tape to contact the leads 101, 103. The pin 701 may form a temporary electrical connection with the LED device to enable testing. This action of punching through tape instead of crushing or pinching has the added advantage that the probe tip is wiped clean and thus avoids clogging of the probe needle.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of packaging a light emitting diode (LED), comprising:
   providing a lead frame comprising a first lead having a first recess in a bottom surface and a second lead having a second recess in a bottom surface;
   placing a LED die over a top surface of at least one of the first and the second leads;
   electrically connecting the LED die to the first lead and to the second lead;
   forming a package around the LED die, the first lead and the second lead, the package having an upper surface, a bottom surface, at least one first side surface extending between the upper surface and the bottom surface and an opening in the upper surface exposing at least the LED die; and
   separating the package containing the LED die, the first lead and the second lead from the lead frame such that the package contains a first castellation and a second castellation in the first side surface of the package;
   wherein:
   (i) the first castellation exposes at least one of the first lead and a first platable metal which is electrically connected to the first lead;
   (ii) the second castellation exposes at least one of the second lead and a second platable metal which is electrically connected to the second lead;
   (iii) the LED die comprises at least one green emitting LED die;
   (iv) the package further comprises:
      a third lead, a fourth lead, a fifth lead and a sixth lead;
      a third castellation in the first side surface of the package, wherein the third castellation exposes at least one of the third lead and a third platable metal which is electrically connected to the third lead;
      a fourth castellation in the first side surface of the package, wherein the fourth castellation exposes at least one of the fourth lead and a fourth platable metal which is electrically connected to the fourth lead;
      a fifth castellation in the first side surface of the package, wherein the fifth castellation exposes at least one of the fifth lead and a fifth platable metal which is electrically connected to the fifth lead;
      a sixth castellation in the first side surface of the package, wherein the sixth castellation exposes at least one of the sixth lead and a sixth platable metal which is electrically connected to the sixth lead;
      at least one blue emitting LED die which is electrically connected to the third lead and to the fourth lead; and
      at least one red emitting LED die which is electrically connected to the fifth lead and to the sixth lead;
   (v) the package comprises an interior wall separating a first compartment containing the at least one green emitting LED die from a second compartment containing the at least one red emitting LED die and the at least one blue LED die;
   (vi) the first compartment contains a first encapsulant containing a green emitting phosphor located over the at least one green emitting LED die; and
   (vii) the second compartment contains a second encapsulant which lacks the green emitting phosphor located over the at least one red emitting LED die and the at least one blue emitting LED die.

2. A method of packaging a light emitting diode (LED), comprising:
   providing a lead frame comprising a first lead having a first recess in a bottom surface and a second lead having a second recess in a bottom surface;
   placing a LED die over a top surface of at least one of the first and the second leads;
   electrically connecting the LED die to the first lead and to the second lead;
   forming a package around the LED die, the first lead and the second lead, the package having an upper surface, a bottom surface, at least one first side surface extending between the upper surface and the bottom surface and an opening in the upper surface exposing at least the LED die; and
   separating the package containing the LED die, the first lead and the second lead from the lead frame such that the package contains a first castellation and a second castellation in the first side surface of the package;
   wherein:
   (i) the first castellation exposes at least one of the first lead and a first platable metal which is electrically connected to the first lead;
   (ii) the second castellation exposes at least one of the second lead and a second platable metal which is electrically connected to the second lead;
   (iii) the LED die comprises at least one green emitting LED die;
   (iv) the package further comprises:
      a third lead, a fourth lead, a fifth lead and a sixth lead;

a third castellation in the first side surface of the package, wherein the third castellation exposes at least one of the third lead and a third platable metal which is electrically connected to the third lead;

a fourth castellation in the first side surface of the package, wherein the fourth castellation exposes at least one of the fourth lead and a fourth platable metal which is electrically connected to the fourth lead;

a fifth castellation in the first side surface of the package, wherein the fifth castellation exposes at least one of the fifth lead and a fifth platable metal which is electrically connected to the fifth lead;

a sixth castellation in the first side surface of the package, wherein the sixth castellation exposes at least one of the sixth lead and a sixth platable metal which is electrically connected to the sixth lead;

at least one blue emitting LED die which is electrically connected to the third lead and to the fourth lead; and at least one red emitting LED die which is electrically connected to the fifth lead and to the sixth lead; and (v) the package comprises at least two interior walls defining at least three separate compartments, wherein the at least one green emitting LED die is located in a first compartment, the at least one red emitting LED die is located in a second compartment and the at least one blue emitting LED die is located in a third compartment.

3. The method of claim 2, wherein:

the first compartment contains a first encapsulant containing a green emitting phosphor located over the at least one green emitting LED die;

the second compartment contains a second encapsulant which lacks the green emitting phosphor located over the at least one red emitting LED die; and the third compartment contains a third encapsulant which lacks the green emitting phosphor located over the at least one blue emitting LED die.

4. The method of claim 3, wherein the second encapsulant and the third encapsulant comprise the same material.

5. The method of claim 3, wherein the second encapsulant contains a red emitting phosphor, and the third encapsulant lacks the green emitting phosphor and the red emitting phosphor.

6. The method of claim 2, wherein:

the second compartment contains a second encapsulant containing a red emitting phosphor located over the at least one red emitting LED die; and the first compartment and the third compartment contain a first and third encapsulant, respectively, where the first and the third encapsulant lack the red emitting phosphor.

7. A packaged light emitting diode (LED) device, comprising:

a first lead having a first recess in a bottom surface;

a second lead having a second recess in a bottom surface;

a LED die located over a top surface of at least one of the first and the second leads and electrically connected to the first lead and to the second lead; and a package located around the LED die, the first lead and the second lead;

wherein:

(i) the package contains an upper surface, a bottom surface, at least one first side surface extending between the upper surface and the bottom surface and an opening in the upper surface exposing at least the LED die;

(ii) the package contains a first castellation and a second castellation in the first side surface of the package;

(iii) the first castellation exposes at least one of the first lead and a first platable metal which is electrically connected to the first lead;

(iv) the second castellation exposes at least one of the second lead and a second platable metal which is electrically connected to the second lead;

(v) the package further comprises:

a third lead, a fourth lead, a fifth lead and a sixth lead;

a third castellation in the first side surface of the package, wherein the third castellation exposes at least one of the third lead and a third platable metal which is electrically connected to the third lead;

a fourth castellation in the first side surface of the package, wherein the fourth castellation exposes at least one of the fourth lead and a fourth platable metal which is electrically connected to the fourth lead;

a fifth castellation in the first side surface of the package, wherein the fifth castellation exposes at least one of the fifth lead and a fifth platable metal which is electrically connected to the fifth lead;

a sixth castellation in the first side surface of the package, wherein the sixth castellation exposes at least one of the sixth lead and a sixth platable metal which is electrically connected to the sixth lead;

at least one blue emitting LED die which is electrically connected to the third lead and to the fourth lead; and at least one red emitting LED die which is electrically connected to the fifth lead and to the sixth lead;

(vi) the package comprises an interior wall separating a first compartment containing the at least one green emitting LED die from a second compartment containing the at least one red emitting LED die and the at least one blue LED die;

(vii) the first compartment contains a first encapsulant containing a green emitting phosphor located over the at least one green emitting LED die; and (viii) the second compartment contains a second encapsulant which lacks the green emitting phosphor located over the at least one red emitting LED die and the at least one blue emitting LED die.

8. A packaged light emitting diode (LED) device, comprising:

a first lead having a first recess in a bottom surface;

a second lead having a second recess in a bottom surface;

a LED die located over a top surface of at least one of the first and the second leads and electrically connected to the first lead and to the second lead; and a package located around the LED die, the first lead and the second lead;

wherein:

(i) the package contains an upper surface, a bottom surface, at least one first side surface extending between the upper surface and the bottom surface and an opening in the upper surface exposing at least the LED die;

(ii) the package contains a first castellation and a second castellation in the first side surface of the package;

(iii) the first castellation exposes at least one of the first lead and a first platable metal which is electrically connected to the first lead;

(iv) the second castellation exposes at least one of the second lead and a second platable metal which is electrically connected to the second lead;

(v) the package further comprises:

a third lead, a fourth lead, a fifth lead and a sixth lead;
a third castellation in the first side surface of the package, wherein the third castellation exposes at least one of the third lead and a third platable metal which is electrically connected to the third lead;
a fourth castellation in the first side surface of the package, wherein the fourth castellation exposes at least one of the fourth lead and a fourth platable metal which is electrically connected to the fourth lead;
a fifth castellation in the first side surface of the package, wherein the fifth castellation exposes at least one of the fifth lead and a fifth platable metal which is electrically connected to the fifth lead;
a sixth castellation in the first side surface of the package, wherein the sixth castellation exposes at least one of the sixth lead and a sixth platable metal which is electrically connected to the sixth lead;
at least one blue emitting LED die which is electrically connected to the third lead and to the fourth lead; and
at least one red emitting LED die which is electrically connected to the fifth lead and to the sixth lead; and
(vi) the package comprises at least two interior walls defining at least three separate compartments, wherein the at least one green emitting LED die is located in a first compartment, the at least one red emitting LED die is located in a second compartment and the at least one blue emitting LED die is located in a third compartment.

9. The device of claim 8, wherein:
the first compartment contains a first encapsulant containing a green emitting phosphor located over the at least one green emitting LED die;
the second compartment contains a second encapsulant which lacks the green emitting phosphor located over the at least one red emitting LED die; and
the third compartment contains a third encapsulant which lacks the green emitting phosphor located over the at least one blue emitting LED die.

10. The device of claim 9, wherein the second encapsulant and the third encapsulant comprise the same material.

11. The device of claim 9, wherein the second encapsulant contains a red emitting phosphor, and the third encapsulant lacks the green emitting phosphor and the red emitting phosphor.

12. The device of claim 8, wherein:
the second compartment contains a second encapsulant containing a red emitting phosphor located over the at least one red emitting LED die; and
the first compartment and the third compartment contain a first and third encapsulant, respectively, where the first and the third encapsulant lack the red emitting phosphor.

13. The device of claim 8, wherein:
the package further has second, third and fourth side surfaces extending between the upper surface and the bottom surface; and
no castellations are located in the second, third and fourth side surfaces of the package.

14. The device of claim 7, wherein:
the package further has second, third and fourth side surfaces extending between the upper surface and the bottom surface; and
no castellations are located in the second, third and fourth side surfaces of the package.

15. The method of claim 1, wherein:
the package further has second, third and fourth side surfaces extending between the upper surface and the bottom surface; and
no castellations are located in the second, third and fourth side surfaces of the package.

16. The method of claim 2, wherein:
the package further has second, third and fourth side surfaces extending between the upper surface and the bottom surface; and
no castellations are located in the second, third and fourth side surfaces of the package.

\* \* \* \* \*